(12) United States Patent
Hong et al.

(10) Patent No.: US 8,692,299 B2
(45) Date of Patent: Apr. 8, 2014

(54) TWO-STEP SHALLOW TRENCH ISOLATION (STI) PROCESS

(75) Inventors: Min Hao Hong, Kaohsiung (TW);
You-Hua Chou, Hsin-Chu (TW);
Chih-Tsung Lee, Hsin-Chu (TW);
Shiu-Ko JangJian, Tainan (TW);
Miao-Cheng Liao, Yunlin (TW); Hsiang Hsiang Ko, Sinying (TW); Chen-Ming Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/594,254

(22) Filed: Aug. 24, 2012

(65) Prior Publication Data

US 2014/0054653 A1    Feb. 27, 2014

(51) Int. Cl.
*H01L 27/085* (2006.01)

(52) U.S. Cl.
USPC ........... 257/255; 257/374; 257/501; 257/506; 257/524; 257/E29.018; 257/E21.545

(58) Field of Classification Search
USPC .......... 257/255, 374, 501, 506, 524, E29.018, 257/E21.545, E29.54
See application file for complete search history.

(56) References Cited

U.S. PATENT DOCUMENTS 7,626,234 B2 * 12/2009 Inoue et al. .................. 257/374
2009/0212329 A1 * 8/2009 Ieong et al. .................. 257/255

* cited by examiner

*Primary Examiner* — Kimberly Rizkallah
*Assistant Examiner* — Timor Karimy
(74) *Attorney, Agent, or Firm* — Slater & Matsil, L.L.P.

(57) ABSTRACT

An integrated circuit device and a process for making the integrated circuit device. The integrated circuit device including a substrate having a trench formed therein, a first layer of isolation material occupying the trench, a second layer of isolation material formed over the first layer of isolation material, an epitaxially-grown silicon layer on the substrate and horizontally adjacent the second layer of isolation material, and a gate structure formed on the epitaxially-grown silicon, the gate structure defining a channel.

20 Claims, 9 Drawing Sheets

TWO-STEP SHALLOW TRENCH ISOLATION (STI) PROCESS

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. However, isolating devices in FETs with sub 65 nm transistor nodes has presented challenges. For example, etching a shallow trench isolation (STI) region trench and filling the STI trench with insulator material becomes more difficult.

One attempt to overcome such challenges involved using tetraethoxysilane (TEOS) as an isolation material. However, use of TEOS may lead to an undesirable humidity absorption concern. In more advanced technology FETs, an oxide is deposited in the STI trench using a high aspect ratio process (HARP) or a Spin-On Glass (SOG) process for device isolation. However, these approaches may require a specific trench profile in order to be successful. For example, an aspect ratio of the STI trench, which is a ratio of the depth to width, may have to be relatively high (e.g., at or above 5). In addition, a slope of the trench may be restricted (e.g., at or below 87 degrees).

In addition to the above, when the STI trench is filled with an insulating material using the HARP process, tensile stress is induced in a channel of the FET and the FET is really only suitable as an NMOS device. On the other hand, when the STI trench is filled using a high density plasma (HDP) process, compressive stress is induced in the channel of the FET and the FET is only really suitable as a PMOS device.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a field effect transistor (FET) metal oxide semiconductor (MOS). The concept may also be applied, however, to other integrated circuits and electronic structures including.

Figure 1:
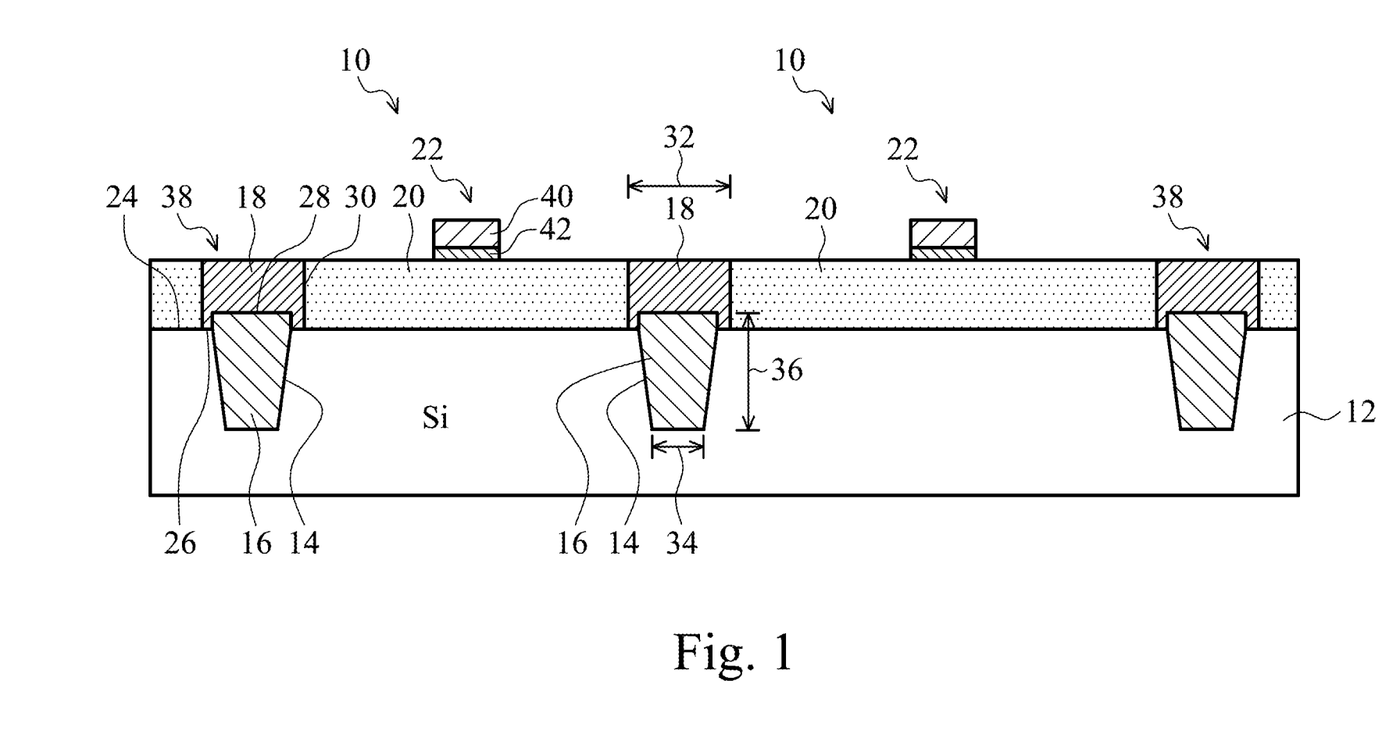
FIG. 1 is a cross section of an embodiment FET device having a two-step STI region.

Referring now to FIG. 1, an embodiment FET device 10 is illustrated. As will be more fully explained below, the FET device 10 includes isolations regions formed using a two-step process. As such, the isolation regions of the FET device 10 are allowed to have a relatively low aspect ratio (e.g., about 3 or less) and are free of restrictive STI trench profile requirements. Moreover, the isolation regions may be formed from high density plasma (HDP) and may employ an N90 or N65 HDP-STI process. Indeed, even a CO11 HDP-STI process may be employed.

Still referring to FIG. 1, the FET device 10 generally includes a substrate 12, a trench 14, a first layer of isolation material 16, a second layer of isolation material 18, an epitaxially-grown silicon layer 20, and a gate structure 22. In an embodiment, the substrate 12 may be formed from a variety of suitable semiconductor materials such as, for example, silicon.

As shown in FIG. 1, the first layer of isolation material 16 occupies or fills the trench 14. In an embodiment, the first layer of isolation material 16 projects above a top surface 24 of the substrate 12. In an embodiment, the first layer of isolation material 16 is a high density plasma (HDP) oxide deposited using a HDP process.

The second layer of isolation material 18 is generally formed over the first layer of isolation material 16. As shown in FIG. 1, the second layer of isolation material 18 is disposed vertically above the first layer of isolation material 16. In an embodiment, the second layer of isolation material 18 caps the first layer of isolation material 16. In other words, the second layer of isolation material 18 encapsulates an upper portion of first layer of isolation material 16. In an embodiment, the second layer of isolation material 18 is a high density plasma (HDP) oxide deposited using a HDP process.

As shown in FIG. 1, the second layer of isolation material 18 may have a bottom surface 26 that abuts or rests upon the top surface 24 of the substrate 12 and a top surface 28 of the first layer of isolation material 16. In addition, a sidewall 30 of the second layer of isolation material 18 may abuts the epitaxially-grown silicon layer 20. In an embodiment, a width 32 of the second layer of isolation material 18 is greater than a width 34 of the first layer of isolation material 16 regardless of where the width of the first layer of isolation material is measured. In others, the width 32 of the second layer of isolation material 18 is greater than the width 34 of the first layer of isolation material 16 at any depth 36 of the first layer of isolation material 16.

The first layer of isolation material 16 and the second layer of isolation material 18 collectively form a two-part isolation structure 38. The two-part isolation structure 38 is generally employed to electrically isolate one FET device 10 from another. Indeed, the two-part isolation structure 38 generally forms, and may be referred to as, a shallow trench isolation (STI) region.

Still referring to FIG. 1, the epitaxially-grown silicon layer 20 is generally grown on the substrate 12. As shown, in an embodiment the epitaxially-grown silicon layer 20 is horizontally adjacent to the second layer of isolation material 18. In an embodiment, the epitaxially-grown silicon layer comprises a silicon germanium (SiGe) or a doped III-V semiconductor material. In an embodiment, the epitaxially-grown silicon layer 20 has a <100> crystal structure, a <110> crystal structure, or a <111> crystal structure. Other semiconductor materials with other crystal structures may also be employed.

In an embodiment, the gate structure 22 (i.e., gate stack) includes, for example, polysilicon layer 40 disposed upon a gate dielectric 42. The gate structure 22 may also be fabricated to include other components such as, for example, spacers, a metal layer, and so on. Such elements have not been expressly depicted in FIG. 1 for ease of illustration.

Figure 2:
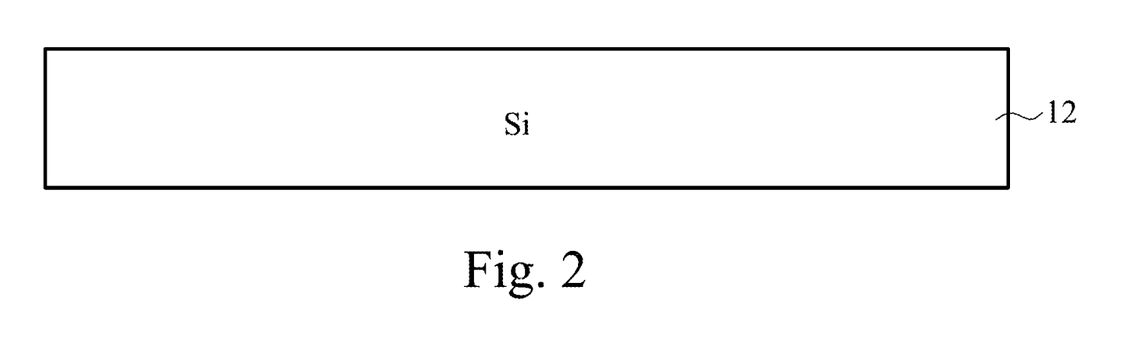
FIGS. 2-17 collectively illustrate a method of forming the FET device of FIG. 1.
Figure 3:
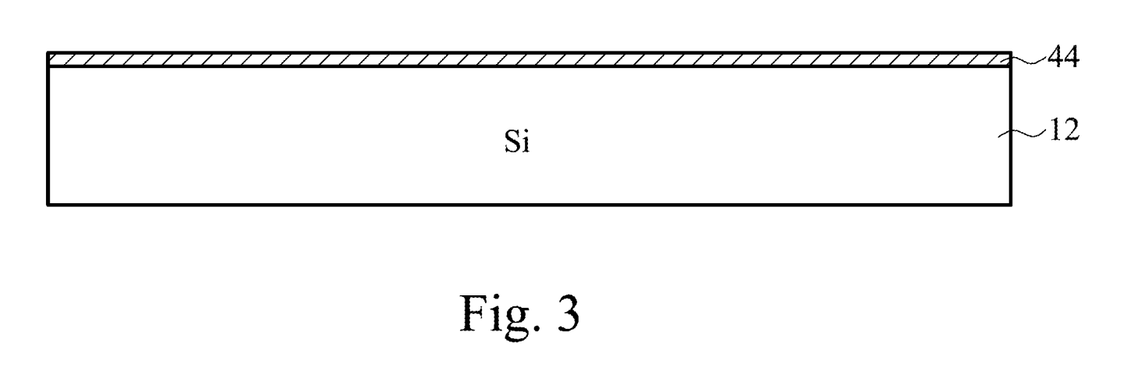
Figure 4:
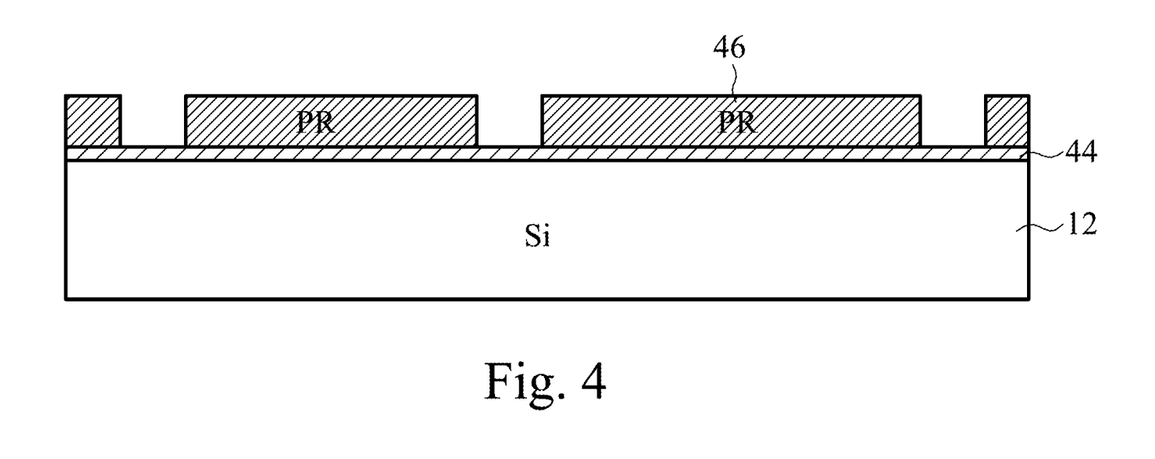

Referring now to FIGS. 2-17, an embodiment method of forming the FET device 10 of FIG. 1 is collectively illustrated. With regard to FIG. 2, the method commences with a cleaning of the silicon substrate 12. Thereafter, as shown in FIG. 3, a nitride layer 44 is deposited on the silicon substrate 12. As shown in FIG. 4, a photoresist 46 is disposed upon portions of the nitride layer 44 to define a pattern for a shallow trench isolation (STI) etch.

Figure 5:
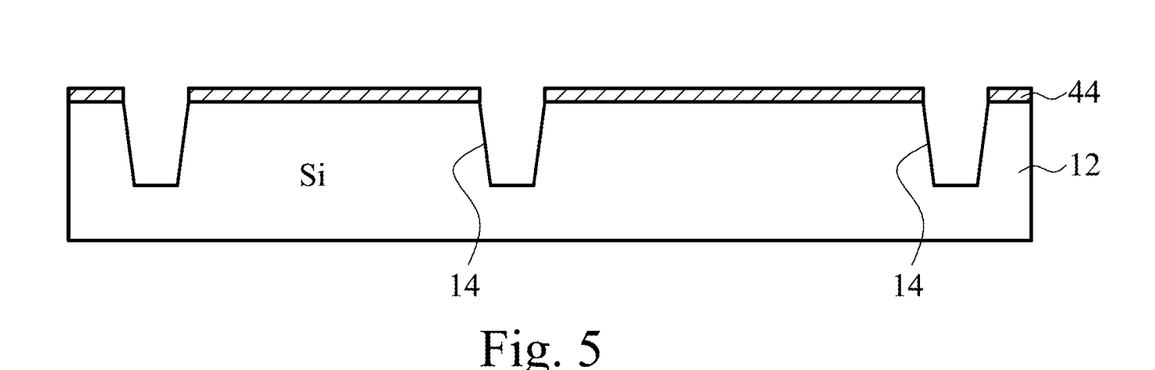
Figure 6:
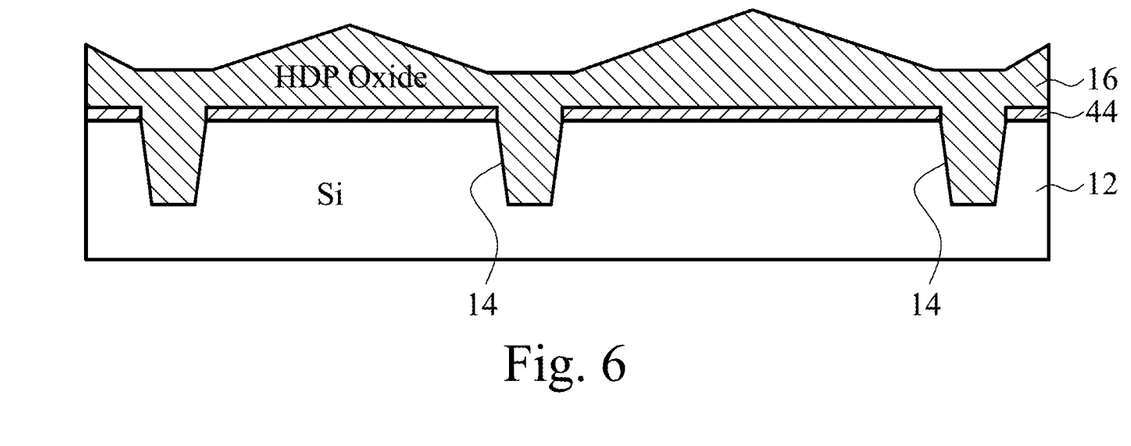
Figure 7:
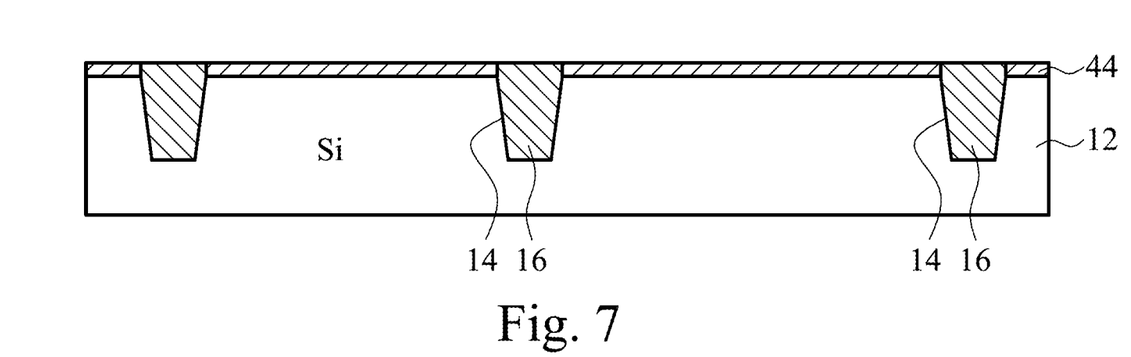

Referring now to FIGS. 4-5, an etching process is performed to remove select portions of the nitride layer 44 and the silicon substrate 12 not protected by the photoresist 46, which produces the trench 14. In an embodiment, the trench 14 has an aspect ratio of below about 3. Moving to FIG. 6, the trench 14 is filled with the first layer of isolation material 16 (e.g., an HDP Oxide deposited through a HDP Oxide deposition process). Thereafter, as shown in FIG. 7, a Chemical-Mechanical Planarization (CMP) process is performed to remove a portion of the first layer of isolation material 16. Indeed, as shown in FIG. 7, after the CMP process the first layer of isolation material 16 occupying the trench 14 and the nitride layer 44 are generally co-planar.

Figure 8:
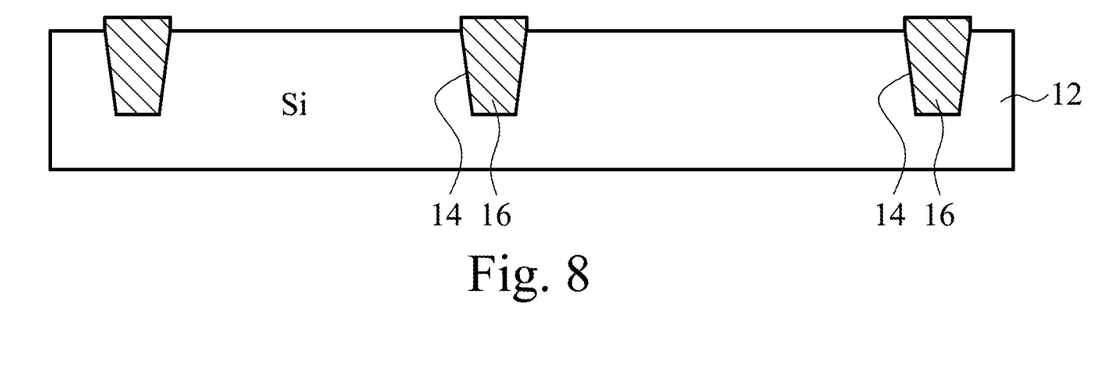
Figure 9:
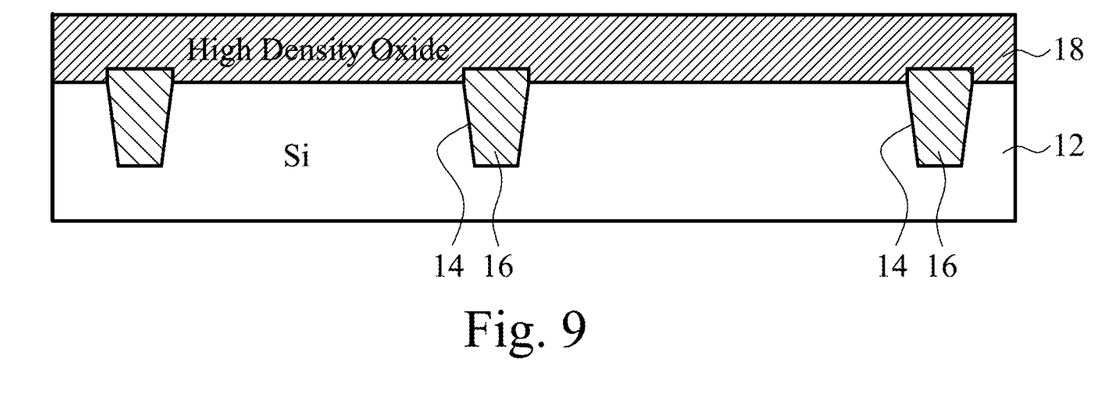
Figure 10:
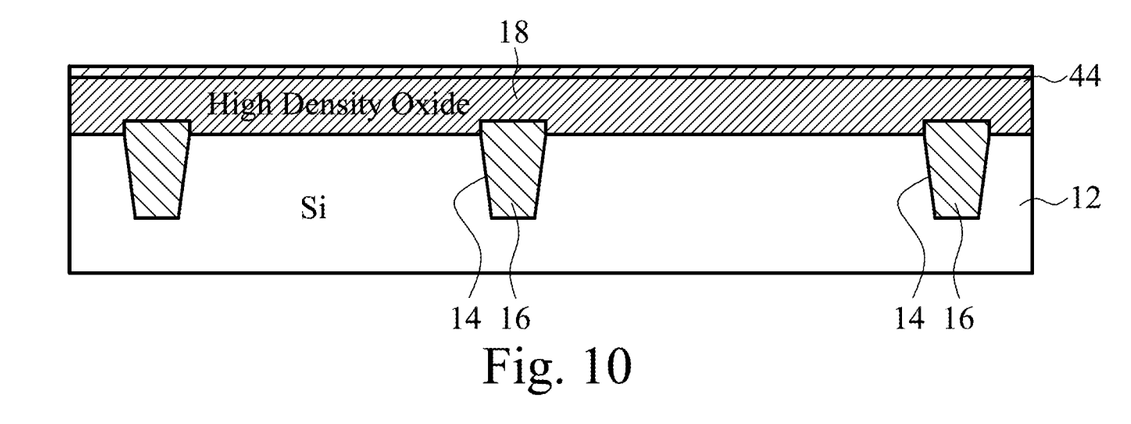

Referring now to FIGS. 7-8, the nitride layer 44 is removed. As shown, removal of the nitride layer 44 causes the first layer of isolation material 16 to project above the top surface 24 of the silicon substrate 12. Next, as shown in FIG. 9, the second layer of isolation material 18 (e.g., an HDP Oxide deposited through a HDP Oxide deposition process) is blanket deposited over the first layer of isolation material 16 and the silicon substrate 12. Thereafter, as shown in FIG. 10, an additional nitride layer 44 is formed over the second layer of isolation material 18.

Figure 11:
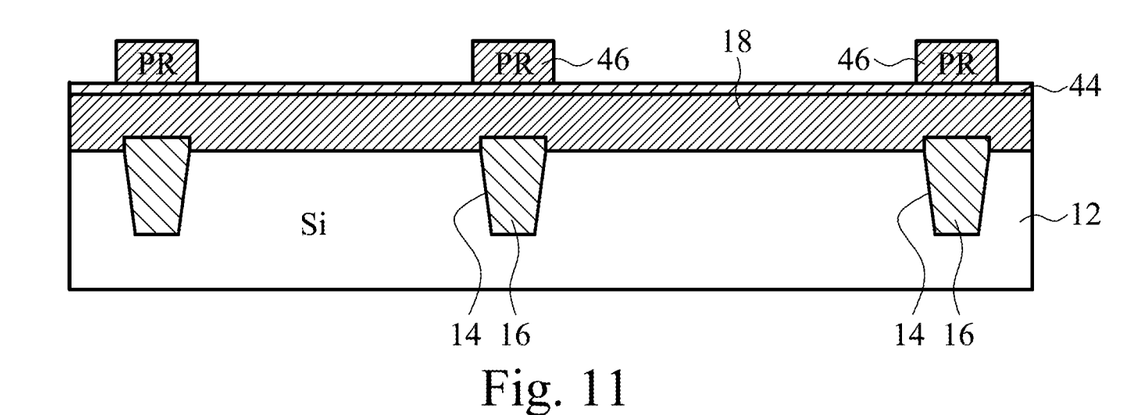
Figure 12:
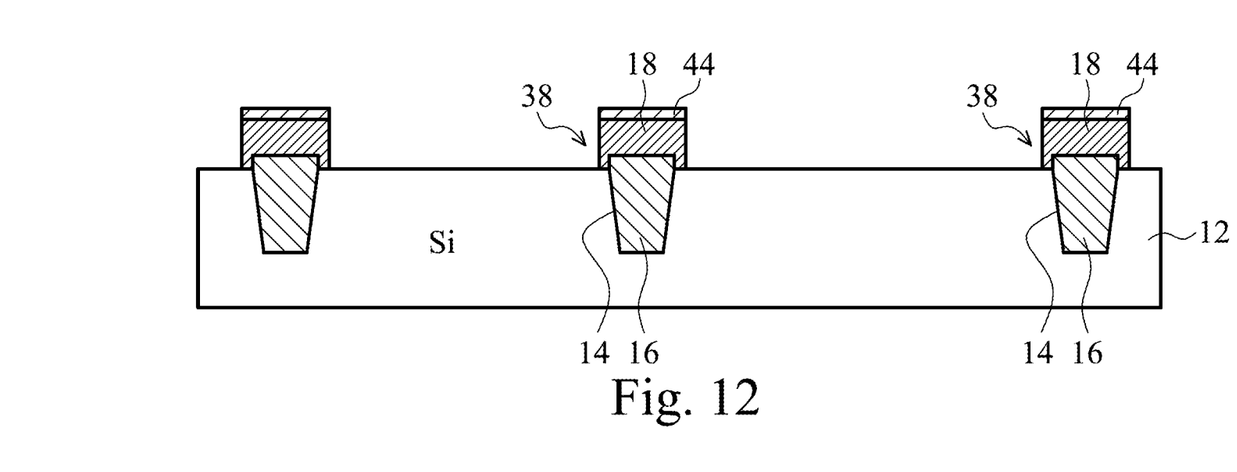

As shown in FIG. 11 another photoresist 46 is disposed upon the additional nitride layer 44 to define a pattern for formation of the two-part STI structure 38 (FIG. 1). Referring now to FIGS. 11-12, an etching process is performed to remove portions of the nitride layer 44 and the second layer of isolation material 18 not protected by the photoresist 46 to define the two-part STI structure 38 beneath the remaining portions of the additional nitride layer 44.

Figure 13:
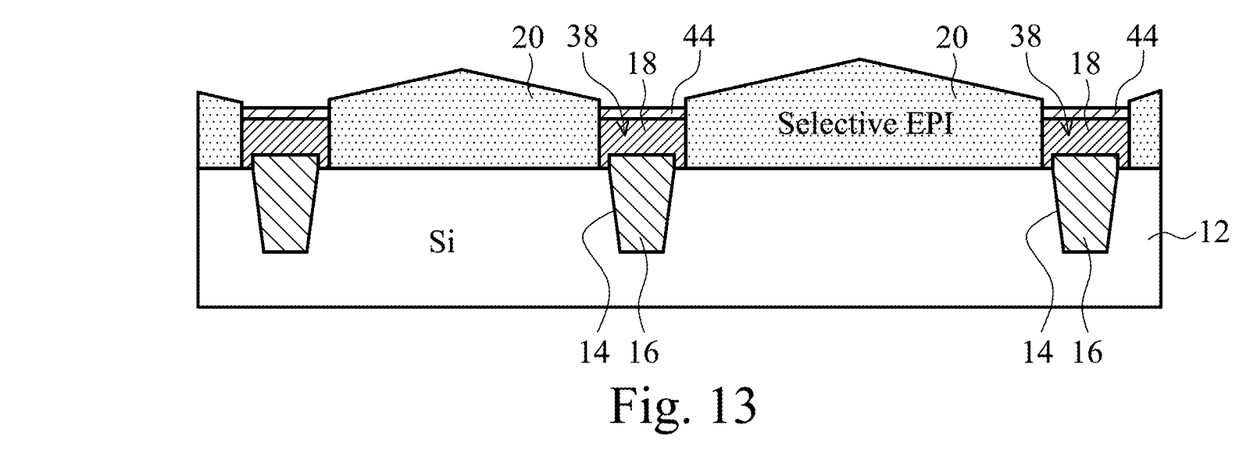
Figure 14:
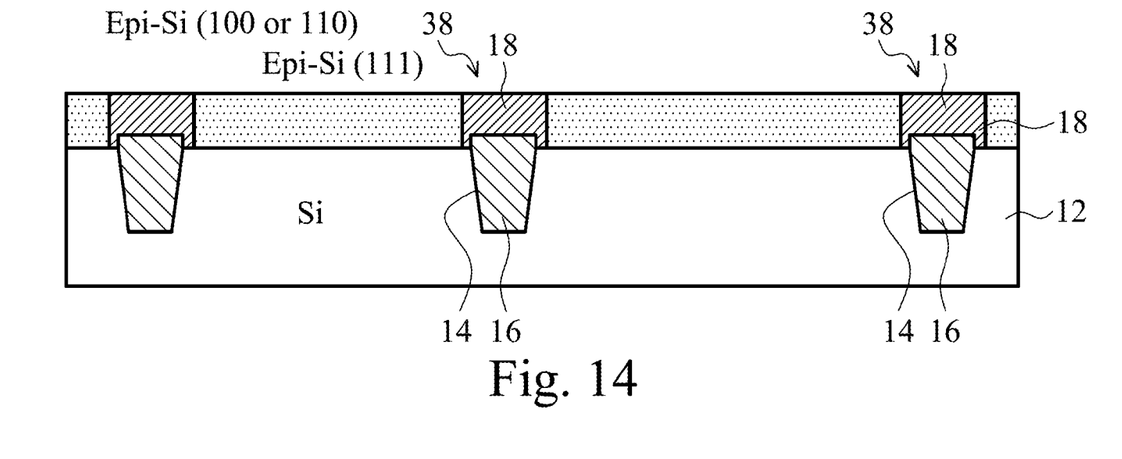

Moving now to FIG. 13, the silicon layer 20 is epitaxially grown on the silicon substrate 12 between adjacent two-part STI structures 38. Thereafter, as shown in FIG. 14, another CMP process is performed to remove a portion of the epitaxially-grown silicon layer 20 as well as the nitride layer 44 remaining over first layer of isolation material 16. As shown in FIG. 14, after the CMP process the epitaxially-grown silicon layer 20 and the second layer of isolation material 18 are generally co-planar. Thereafter, a hydrogen anneal process is performed to repair and relax the epitaxially-grown silicon layer 20. As noted above, the epitaxially-grown silicon layer 20 may be afforded a <100> crystal structure, a <110> crystal structure, or a <111> crystal structure, depending on the performance characteristics desired for the FET device 10 (FIG. 1).

Figure 15:
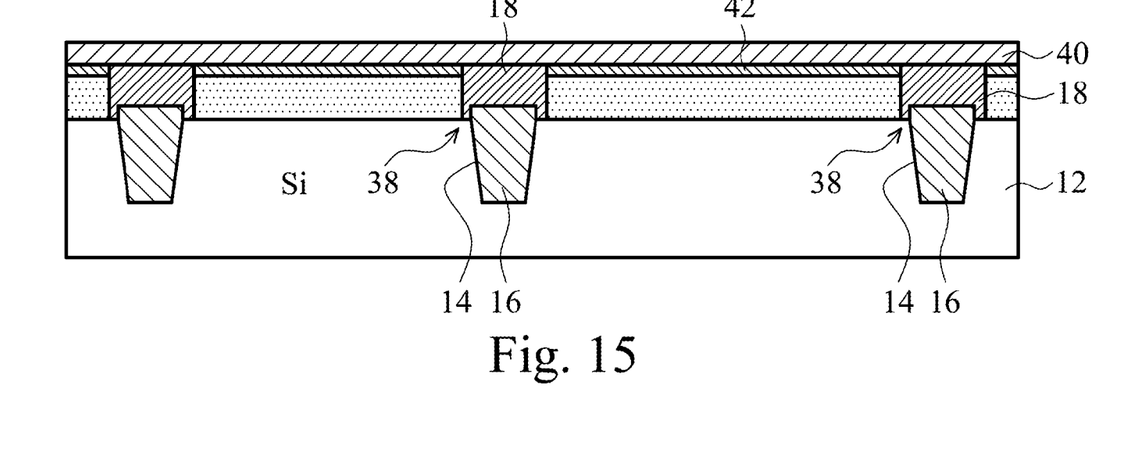
Figure 16:
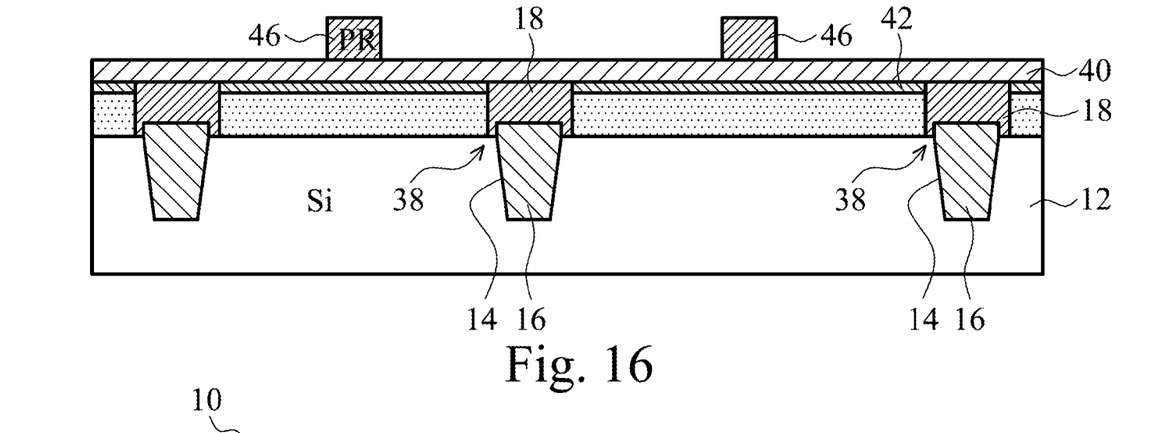
Figure 17:
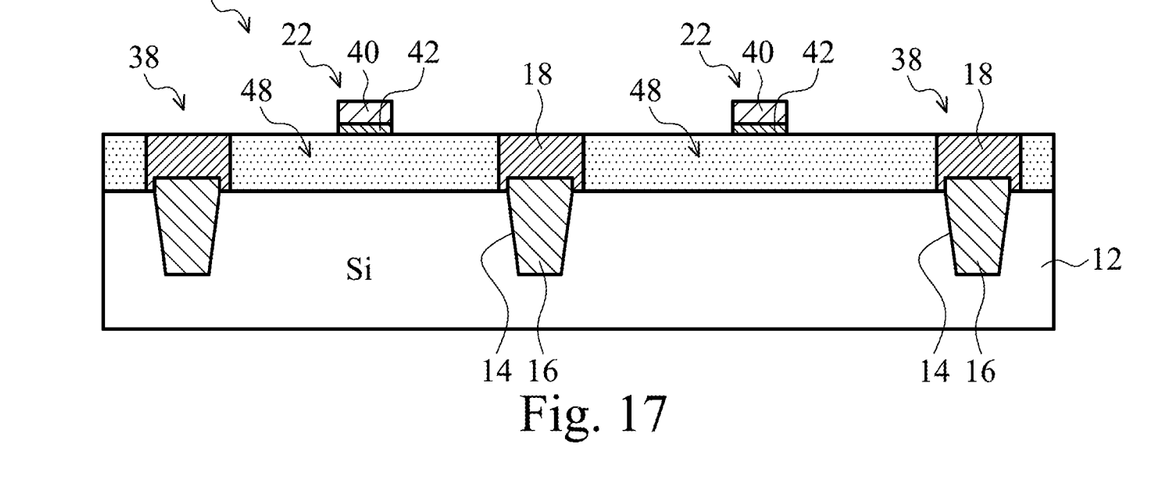

Referring now to FIG. 15, a gate material cleaning and deposition process is performed. As shown, the gate dielectric 42 and polysilicon layer 40, among other components, may be formed over the two-part STI structure 38 during this process. Thereafter, as shown in FIG. 16, another photoresist 46 is disposed upon the polysilicon layer 40 to define a pattern for formation of the gate structure 22 (FIG. 1). Referring now to FIGS. 16-17, an etching process is performed to remove portions of the polysilicon layer 40 and the gate dielectric 42 not protected by the photoresist 46 to define the gate structure 22 above the epitaxially-grown silicon layer 20 and form the FET device 10 of FIG. 1. It should be recognized that further or additional fabrication or manufacturing steps or processes may be performed to form or augment the FET device 10 of FIG. 1. However, for the sake of brevity such additional steps or processes have been omitted.

The FET device 10 of FIGS. 1 and 17 has several advantages relative to conventional or known FET devices. For example, the FET device 10 mitigates or eliminates STI trench etch and insulator material gap-filling difficulties. The FET device 10 may also include an STI region formed using HDP Oxide and an HDP Oxide process in sub 40 nm nodes.

In addition to the above, the FET device 10 has a lower aspect ratio (e.g., about 3) relative to conventional FET devices that mandate a higher aspect ratio (e.g., about 5). Moreover, the FET device 10 is not limited to conventional STI trench profile requirements. In addition, the FET device 10 generates less stress in a channel 48 disposed beneath the gate structure 22 (FIG. 17), which makes the FET device 10 suitable for both PMOS and NMOS applications. Indeed, the FET device 10 avoids the STI stress impact to the channel 48 and induced drain saturation current ($I_{dsat}$) performance loss.

In an embodiment, an integrated circuit device including a substrate having a trench formed therein, a first layer of isolation material occupying the trench, a second layer of isolation material formed over the first layer of isolation material, an epitaxially-grown silicon layer on the substrate and horizontally adjacent the second layer of isolation material, and a gate structure formed on the epitaxially-grown silicon, the gate structure defining a channel.

In an embodiment, an integrated circuit device including a silicon substrate having a trench formed therein, a two-part isolation structure supported by the substrate, the two part isolation structure including a first oxide layer and a second oxide layer, the first oxide layer filling the trench and projecting above the silicon substrate, the second oxide layer capping the first oxide layer, an epitaxially-grown silicon layer on the silicon substrate and horizontally adjacent the two-part isolation structure, and a gate structure formed on the epitaxially-grown silicon, the gate structure defining a channel.

In an embodiment, a method of forming an integrated circuit device including etching a trench in a silicon substrate, depositing a first layer of isolation material in the trench, the first layer of isolation material projecting above surface of the silicon substrate, capping the first layer of isolation material by depositing a second layer of isolation material, epitaxially-growing a silicon layer upon the silicon substrate, the silicon layer horizontally adjacent to the second layer of isolation material, and forming a gate structure on the silicon layer, the gate structure defining a channel.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:
1. An integrated circuit device, comprising:
a substrate having a trench formed therein;
a first layer of isolation material occupying the trench;
a second layer of isolation material formed over the first layer of isolation material, the second layer of isolation material extending along at least a portion of sidewalls of the first layer of isolation material;

an epitaxially-grown silicon layer on the substrate and horizontally adjacent the second layer of isolation material; and a gate structure formed on the epitaxially-grown silicon layer, the gate structure defining a channel.

2. The integrated circuit device of claim 1, wherein the first layer of isolation material is a high density plasma oxide.

3. The integrated circuit device of claim 1, wherein the second layer of isolation material is a high density plasma oxide.

4. The integrated circuit device of claim 1, wherein the second layer of isolation material caps the first layer of isolation material.

5. The integrated circuit device of claim 1, wherein the second layer of isolation material abuts the substrate.

6. The integrated circuit device of claim 1, wherein the first layer of isolation material projects above a surface of the substrate.

7. The integrated circuit device of claim 1, wherein the epitaxially-grown silicon layer comprises a silicon germanium.

8. The integrated circuit device of claim 1, wherein the epitaxially-grown silicon layer comprises a doped III-V semiconductor material.

9. The integrated circuit device of claim 1, wherein the epitaxially-grown silicon layer has one of a <100> crystal structure, a <110> crystal structure, and a <111> crystal structure.

10. The integrated circuit device of claim 1, wherein a bottom surface of the second layer of isolation material abuts a top surface of the first layer of isolation material and a top surface of the substrate.

11. The integrated circuit device of claim 1, wherein a sidewall of the second layer of isolation material abuts the epitaxially-grown silicon layer.

12. The integrated circuit device of claim 1, wherein a width of the second layer of isolation material is greater than a width of the first layer of isolation material measured at any depth.

13. The integrated circuit device of claim 1, wherein the substrate is formed from silicon.

14. An integrated circuit device, comprising:
a silicon substrate having a trench formed therein;
a two-part isolation structure supported by the silicon substrate, the two part isolation structure including a first oxide layer and a second oxide layer, the first oxide layer filling the trench and projecting above the silicon substrate, the second oxide layer capping the first oxide layer such that the second oxide layer abuts at least a portion of sidewalls of the first oxide layer;

an epitaxially-grown silicon layer on the silicon substrate and horizontally adjacent the two-part isolation structure; and a gate structure formed on the epitaxially-grown silicon, the gate structure defining a channel.

15. The integrated circuit device of claim 14, wherein the first oxide layer and the second oxide layer are formed from high density plasma oxide.

16. The integrated circuit device of claim 14, wherein the epitaxially-grown silicon layer comprises one of a silicon germanium and a doped III-V semiconductor material.

17. The integrated circuit device of claim 16, wherein the epitaxially-grown silicon layer has one of a <100> crystal structure, a <110> crystal structure, and a <111> crystal structure.

18. The integrated circuit device of claim 14, wherein a width of the second oxide layer is greater than a width of the first oxide layer measured at any depth.

19. An integrated circuit device, comprising:
a silicon substrate having a trench formed therein;
a two-part isolation structure supported by the silicon substrate, the two part isolation structure including a first oxide layer and a second oxide layer, the first oxide layer filling the trench and projecting above the silicon substrate, the second oxide layer and the silicon substrate encapsulating the first oxide layer such that the second oxide layer abuts at least a portion of sidewalls of the first oxide layer;

an epitaxially-grown silicon layer on the silicon substrate and horizontally adjacent the two-part isolation structure; and a gate structure formed on the epitaxially-grown silicon, the gate structure defining a channel.

20. The integrated circuit device of claim 19, wherein the first oxide layer and the second oxide layer are formed from high density plasma oxide, the epitaxially-grown silicon layer comprises one of a silicon germanium and a doped III-V semiconductor material, and a width of the second oxide layer is greater than a width of the first oxide layer measured at any depth.

* * * * *